United States Patent [19]

Hafner et al.

[11] Patent Number: 5,787,462
[45] Date of Patent: Jul. 28, 1998

[54] SYSTEM AND METHOD FOR MEMORY MANAGEMENT IN AN ARRAY OF HEAT PRODUCING DEVICES TO PREVENT LOCAL OVERHEATING

[75] Inventors: James Lee Hafner, San Jose; John Anthony Tomlin, Sunnyvale; Larry Lynn Williams, Los Altos, all of Calif.

[73] Assignee: International Business Machines Corporation, Armonk, N.Y.

[21] Appl. No.: 609,202

[22] Filed: Mar. 1, 1996

Related U.S. Application Data

[62] Division of Ser. No. 350,923, Dec. 7, 1994, Pat. No. 5,530,658.

[51] Int. Cl.⁶ .................. G06F 12/02; G06F 9/312
[52] U.S. Cl. .................. 711/114; 711/100; 711/101; 711/111; 711/154; 711/172
[58] Field of Search .................. 395/441, 427, 395/428, 438, 481, 497.01, 497.02, 182.05, 750; 364/578; 307/125

[56] References Cited

U.S. PATENT DOCUMENTS

| | | | |
|---|---|---|---|
| 5,423,046 | 6/1995 | Nunnelley et al. | 395/750 |
| 5,438,226 | 8/1995 | Kuchta | 307/125 |
| 5,530,658 | 6/1996 | Hafner et al. | 364/578 |
| 5,546,558 | 8/1996 | Jacobson et al. | 395/441 |
| 5,574,851 | 11/1996 | Rathunde | 395/182.05 |
| 5,598,549 | 1/1997 | Rathunde | 395/441 |

*Primary Examiner*—Eddie P. Chan
*Assistant Examiner*—Than V. Nguyen
*Attorney, Agent, or Firm*—Baker Maxham Jester & Meador

[57] ABSTRACT

A configuration management subsystem of a subsystem array system assigns heat producing devices to clusters such that the number of devices activated will not create overheating, regardless of which limited set of clusters is activated. The subsystem receives the dimensions of the disk array, the number of devices, the number of cluster groups and the maximum number of clusters that can be operated substantially simultaneously, and the dimensions of a critical box that defines an arrangement of the devices into cells such that, if a device is assigned to each cell of the critical box and all devices are operated simultaneously, then thermal operating restrictions of the devices will be exceeded. The system first executes simple numbering loop operations to determine, if they exist, dimensions of a building block subarray that meet certain requirements relative to the input parameters. Using this building block subarray, the system then executes other simple numbering loop operations in which number labels are assigned to the disk devices (representing assignment of devices to disjoint clusters) such that if the maximum number of clusters are operating simultaneously, in every critical box subarray at least one device will not be operated.

18 Claims, 8 Drawing Sheets

SYSTEM AND METHOD FOR MEMORY MANAGEMENT IN AN ARRAY OF HEAT PRODUCING DEVICES TO PREVENT LOCAL OVERHEATING

This application is a division of application Ser. No. 08/350.923, filed Dec. 07, 1994, now U.S. Pat. No. 5,530,658.

BACKGROUND OF THE INVENTION

1. Field of the Invention

This invention relates generally to the construction and operation of device arrays and, more particularly, to arranging heat producing devices into an array and operating them in accordance with device thermal operating restrictions to avoid hotspots.

2. Description of the Related Art

It frequently is necessary to arrange multiple heat producing devices into an array for simultaneous or near simultaneous operation. Common examples include arranging electronic components on a circuit board and also operating magnetic disk drive storage devices in an array. The heat produced by the devices typically affects the operation and lifetime of the devices so that they must be spatially separated in the array according to thermal restrictions. The thermal restrictions typically are established to prevent local overheating or "hot spots" that otherwise would produce adverse heating effects.

In the case of arranging electronic heat-producing components, for example, the task might be represented by placing the components on the circuit board by dividing the board into a grid, or two-dimensional array, of cells into which the components are placed such that no overheating occurs. The case of arranging and operating a magnetic disk drive array can best be represented by the technique of storing data across redundant arrays of inexpensive disks, a storage array architecture commonly referred to by the acronym RAID. In the RAID technique, an array of relatively inexpensive disk storage devices is provided and data is stored in multiple locations distributed across the array of disk devices. In some variations of the RAID technique, corresponding parity data also is stored.

Each disk device of a RAID system typically includes multiple cylinders or platters that receive data for storage and includes a separate heat producing drive motor. A RAID system typically includes from ten to one hundred disks housed in spaced apart racks that permit cooling air to flow between devices. The data, typically comprising multiple records, is duplicated or in some cases subdivided and stored across the drives in clusters at different respective locations of the disks according to a predetermined pattern. For example, the same data might be stored on the second platter of the first drive, the third platter of the second drive, the fourth platter of the third drive, and so forth until it is stored on the first platter of the last drive. Other data records would be similarly stored. A large variety of storage patterns can be followed for storing data. Likewise, data that is to be retrieved from the array in a read operation is extracted from the disks according to the same pattern and is reconstructed.

Such an arrangement of data across disks is commonly referred to as "striping" and advantageously permits data recovery if one of the disk units fails. Thus, clusters of disk drives within the array are accessed with each data storage operation so that each disk drive in a cluster that is accessed incurs a disk operation. The disk storage devices each generate heat when they are accessed and therefore the devices must be spatially separated. Configuring the devices into clusters ensures that the number of devices operated with each storage operation likely will not violate the device thermal restrictions. Other techniques are known for configuring clusters of multiple disk devices in arrays to distribute storage operations and avoid overheating.

Conventional RAID systems typically include arrays of from ten to one hundred disks. The recent trend in data storage systems is to larger and denser RAID systems that can exceed conventional packaging and power handling capabilities. For example, a disk array that is to provide 10-terabyte of storage that consumes power at a typical rate of 50 mW per megabyte would require 500 kW of input power to service the disk devices. This amount of input power would create a cooling problem that would be unacceptable to most users and could involve the placement of thousands of disk drives. Methods for configuring clusters of devices in a disk array can be relatively complicated and can require substantial computing resources. Similarly, determining a satisfactory arrangement of electronic components on a circuit board can become difficult with the increasing density of device packaging.

From the discussion above, it should be apparent that there is a need for a system that determines a configuration of heat producing devices in an array so that thermal restrictions are satisfied to prevent local overheating or "hot spots" from occurring without need for substantial computing resources. The present invention satisfies this need.

SUMMARY OF THE INVENTION

In accordance with the invention, a plurality of devices in a system that are arranged in an array and generate heat when operated are assigned to equal-sized operational groups called clusters such that all the devices in a cluster are operated substantially simultaneously with every operation of the system. The devices are assigned to clusters subject to the restriction that, whenever the maximum permissible number of clusters are operating, not all the devices in any subarray called a critical box shall be operating. A critical box is defined to be a rectangular subarray such that, if all the devices in any such subarray are operated simultaneously, then thermal operating restrictions of the devices will be exceeded. To begin the cluster assignment, a building block volume is constructed that comprises an integral sub-volume of the device array. The building block can be larger or smaller than the critical box in any dimension. In the next step of the cluster assignment, a number label is assigned to each cell of the device array in integral multiples of the quotient of the device array volume divided by the building block volume, representing preliminary cluster assignments of the corresponding devices. Thereafter (and only if required), repeated partitioning of the number labels is conducted such that (1) each cluster gets exactly the same number of devices as every other cluster and (2) each subarray having dimensions equal to those of the building block includes at most one device from each cluster. The final number labels represent the final cluster assignments of the corresponding devices. The cluster assignment task as described can be performed on a relatively simple computer, so that a wide variety of systems having heat producing devices that must be operated substantially simultaneously can be configured and operated with minimal computational resources. The cluster assignment process, for example, can be performed in real time as system needs change. The process can therefore be applied to a variety of configuration tasks relating to placement of heat producing devices in an array, such as placement of electronic components on a circuit board and controlling arrays of disk storage devices in a computer system.

In one aspect of the invention, a configuration management subsystem of a computer system assigns storage devices to clusters such that the number of devices activated will not create overheating, regardless of which clusters are activated—up to the maximum—by carrying out a computational process that quickly makes the proper assignment with a minimal computational load. The configuration management subsystem assigns devices to clusters by first determining the axis dimensions of a building block that satisfies assumptions necessary for the existence of an assignment solution in accordance with the present invention. The subsystem then assigns labels without repetition to cells of the building block. The subsystem next replicates the label assignment in the building block along a first box dimension as many times as necessary to provide cells sufficient to contain all of the disk drives in the array. The subsystem next partitions the set of replicated building block label assignments along the remaining box dimension(s) until all dimensions have been processed. After a final partitioning of the labels, if it should be necessary, and after ensuring that the number of cells assigned with different labels is sufficient to accommodate all the disk drives in the array, the drives are assigned to these respective clusters for operation such that all devices in a cluster are operated substantially simultaneously with each operation of the storage devices. This can be carried out once the dimensions of the device array and the number of cells in which the devices will be arranged are known, along with the number of operational devices in an operating cluster, and the number L of clusters that will be simultaneously operated at any one time.

Other features and advantages of the present invention should be apparent from the following description of the preferred embodiment, which illustrates, by way of example, the principles of the invention.

DESCRIPTION OF THE PREFERRED EMBODIMENT

Figure 1:
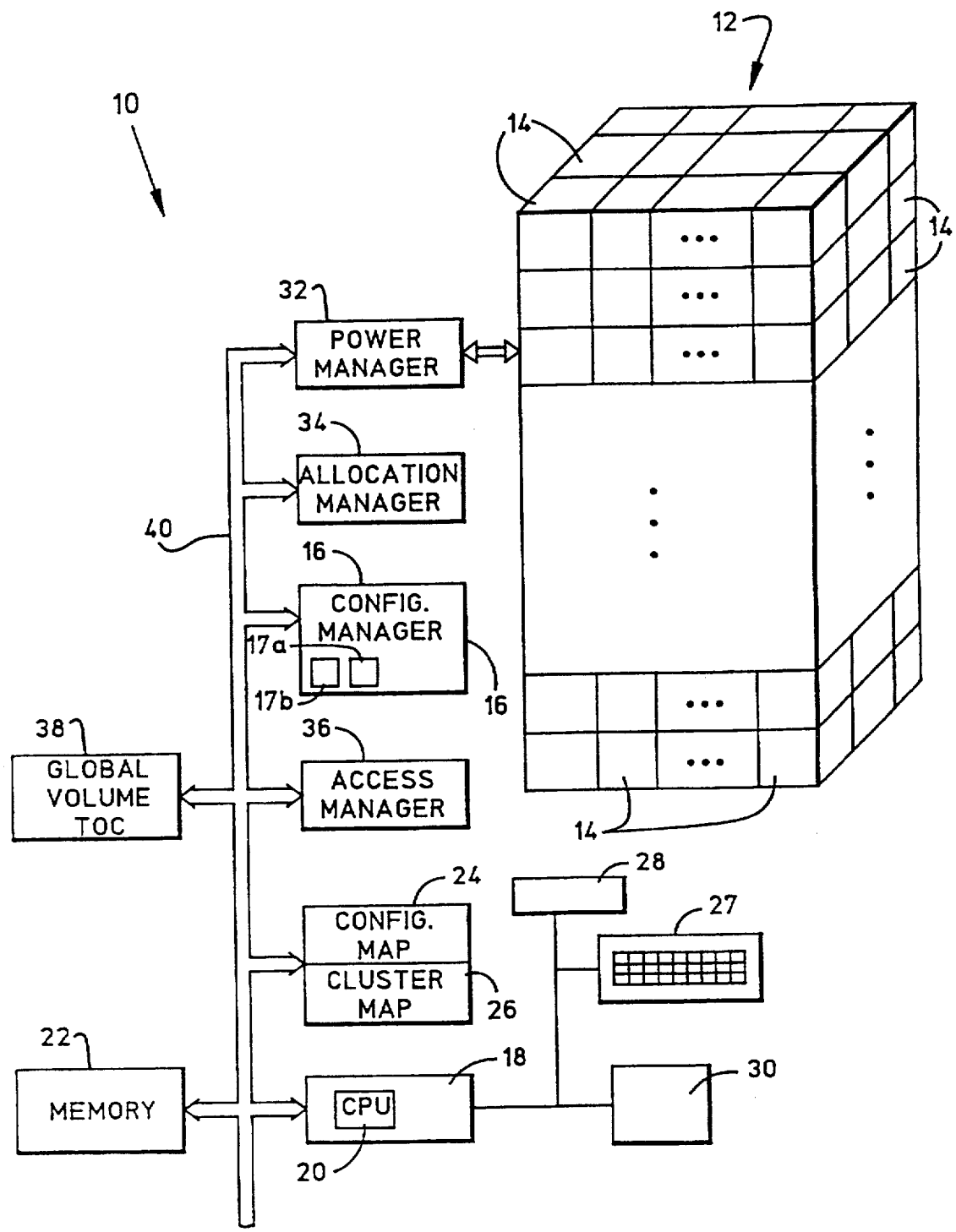
FIG. 1 is block diagram of a computer storage system constructed in accordance with the present invention.

FIG. 1 shows a preferred embodiment of a computer storage system 10 that implements a disk configuration management process in accordance with the present invention. The storage system includes a disk array 12 having a plurality of magnetic disk storage devices 14, which are represented as cells in the array. Each disk device produces heat whenever a disk read or write operation is performed due to, for example, a drive motor of the disk device. The disks are assigned to a number of cluster groups that comprise a mapping of disks to clusters such that a data record is stored redundantly to each disk of one cluster group, in accordance with the RAID methodology. Thus, each read or write operation results in simultaneous or near simultaneous disk access operations, each of which generates heat.

The system 10 includes a configuration manager 16 that receives the dimensions $n1$, $n2$, $n3$ of the device array, the number of cluster groups C, and dimensions $k1$, $k2$, $k3$ of a critical box that defines an arrangement of the storage devices into cells such that, if a storage device is assigned to each cell of the critical box and all devices are operated simultaneously, then thermal operating restrictions of the devices will be exceeded. The configuration manager then constructs a building block volume, assigns a number label to each cell of the building block, and replicates the building block volume a sufficient number of times to duplicate the device array volume. Thereafter, repeated partitioning of the number labels representing assignment of storage devices to operating clusters is conducted such that (1) each cluster includes a number of different labels equal to $(n1*n2*n3)/C$, and (2) each building block volume of the device array includes at most one device from each cluster. The devices are then operated according to the cluster assignments. The system can configure large storage systems and can be applied equally well to other configuration tasks relating to placement of heat producing devices in an array, such as placement of electronic components on a circuit board and the like. These tasks are implemented with a building block construction subsystem 17a and cluster assignment subsystem 17b of the configuration manager 16. In this way, the storage device assignment can be carried out with a computer system of relatively modest computing power and can be performed in real time as system needs change.

The computer system 10, for example, can include an International Business Machines (IBM) Corporation "Personal Computer" or Personal Computer-compatible machine 18 and the disk array 12 can comprise a RAID-type system of multiple 5¼" hard disk drives as described above. A wide variety of other computers and storage arrays also are compatible with the teachings of the present invention. The configuration manager 16 can be implemented as one of the processes performed by the central processing unit (CPU) 20 of the machine. The configuration manager makes use of working memory 22 of the machine to temporarily store computations and device assignments. It is to be understood that the numbering and labelling assignments described in connection with disk drives refer to logical blocks and volumes and not physical divisions. Numbering operations are understood to be integer operations.

After the devices are mapped to cluster groups, the configuration manager stores the mapping information in a configuration map 24 and cluster map 26 described further below. The data relating to the device array, cluster groups, and critical box can be provided in the memory at system start-up or initialization, or can be provided in an interactive manner from a terminal input device, such as a keyboard 27. If desired, results of the configuration task assignment can be reported to a user using an output device, such as a printer 28 or video monitor 30.

The configuration task advantageously can be performed by the CPU 20 of the BIM Corporation "Personal Computer" 18 without need for assistance from-larger, more powerful machines. This is achieved bacause, as described further below, configuration is performed with relatively simple numbering loop operations. Thus, the configuration task can be carried out by the configuration manager 16 initially prior to delivery and user operation of the system 10, or at the time of delivery during system set-up, or can be performed at various intervals interactively on demand by the user. This flexibility permits a user to select a configuration that meets specific requirements for an installation and to respond quickly to changes in operational demands.

Regardless of the specific manner in which the configuration manager 16 implements the configuration task, the configuration manager receives data indicative of the storage parameters, including the size of the disk array, the RAID implementation, the number of clusters, and thermal operating restrictions. The data can include the size of the critical box or, if desired, the configuration manager can determine the size of the critical box based on the data received. It should be understood that, to determine the size of the critical box, the configuration manager will require information concerning thermal generation and maximum loading of the devices. Such determinations will be known to those skilled in the art and do not form part of the invention herein. The cluster map 26 determined by the configuration manager comprises a mapping that will permit all devices in a cluster to be operated simultaneously without creating a local "hot spot" or other overheating sufficient to violate the thermal restrictions.

A disk power manager 32 manages the read and write operations in the disk array 12 so that at any point in time some disk devices are active, meaning that power is applied to their respective disk motors in preparation for a read or write operation, and others are inactive, meaning that they are in a relatively low-power state and are not ready to read or write. It should be understood that a disk device generates little or no thermal energy in the inactive state but can generate its fully-rated thermal load in the active state. More particularly, the power manager sequences the read and write operations of the disk devices 14 in the disk array 12 in accordance with the RAID architecture implemented and the configuration determined by the configuration manager 16. When a read or write operation is to be performed, the power manager 32 determines which cluster will be accessed and consults the cluster map 26 to determine the disk devices that will be involved.

The system 10 also includes an allocation manager 34 and an access manager 36 and a global volume table of contents 38, which pass information over a data/command bus 40 to the other elements of the system. The allocation manager and access manager assist the power manager 32 in controlling operation of the disk devices. For example, the allocation manager provides the configuration mapping information to the power manager 32. The details of such operations do not form part of the present invention, are well-known to those skilled in the art, and require no further explanation. A system in which such operations are more particularly explained is described in U.S. Pat. No. 5/423,046 assigned to the assignee of the present application, entitled High Capacity Data Storage System Using Disk Array, which is incorporated herein by this reference.

Figure 2:
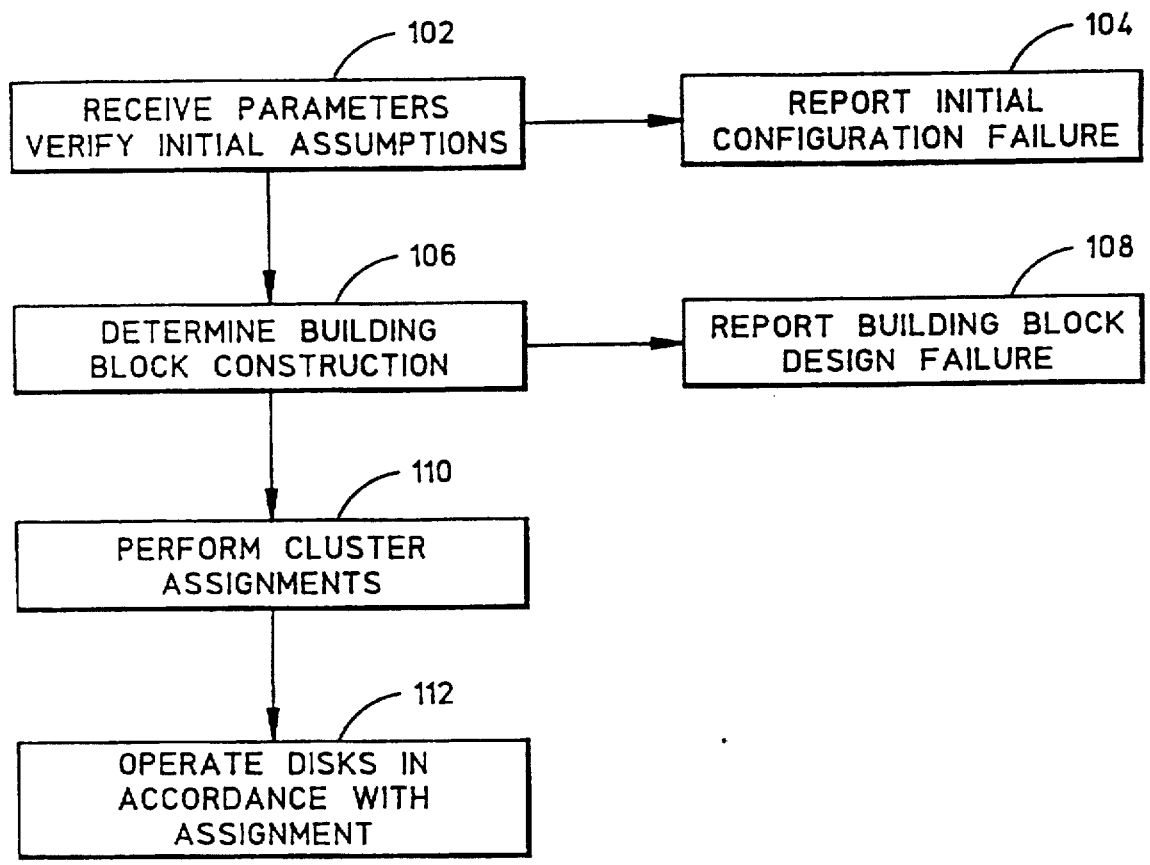
FIG. 2 is a flow diagram of the operational steps followed by the configuration manager illustrated in FIG. 1.

FIG. 2 is a flow diagram of the operational steps followed by the configuration manager 16 in carrying out the cluster assignment task. In the first operational step, represented by the flow diagram box numbered 102, the dimensions of the array of storage devices, the number of clusters, the dimensions of the critical box and the maximum number of clusters that will be simultaneously operated at any one time are input to the configuration manager. Also in box 102, the system computes the total number of devices as the product of the dimensions of the array and verifies that the number of clusters it received as input is an integral divisor of the number of storage devices. If this verification fails, then the system reports an initial configuration failure at the flow diagram box numbered 104. The cluster assignment processing then halts. If verification did not fail, then processing is passed to the cluster assignment start subsystem at box 106, which attempts to determine the dimensions of a building block satisfying certain requirements described further below. In the step represented by box 106, the system can select a dimension tuple that specifies the dimensions of a building block by selecting from a set of tuples received as input or by calculating a set of tuples comprising possible building blocks. In the preferred embodiment, the set of tuples is calculated. This process if described in greater detail below.

If a building block that satisfies the requirments cannot be found, then the system reports a failure to determine a building block at the flow diagram box numbered 108. Otherwise, at box 110, processing is passed to the cluster assignment packing subsystem, which performs the cluster assignments according to the invention by labelling devices according to the assignments. Finally, at the box numbered 112, the devices of the disk array are operated in accordance with the cluster assignments specified at box 110. Those skilled in the art will understand that such operation comprises a cluster operation decision under control of the power manager (FIG. 1). Thus, if the power manager determines that all devices of the first cluster should be operated, then it commands that all devices corresponding to the cells in the final constructed array having a number label of "1" are operated. If all devices of the second cluster should be operated, than all devices labelled "2" are operated, and similarly for devices in the remaining clusters.

Figure 3:
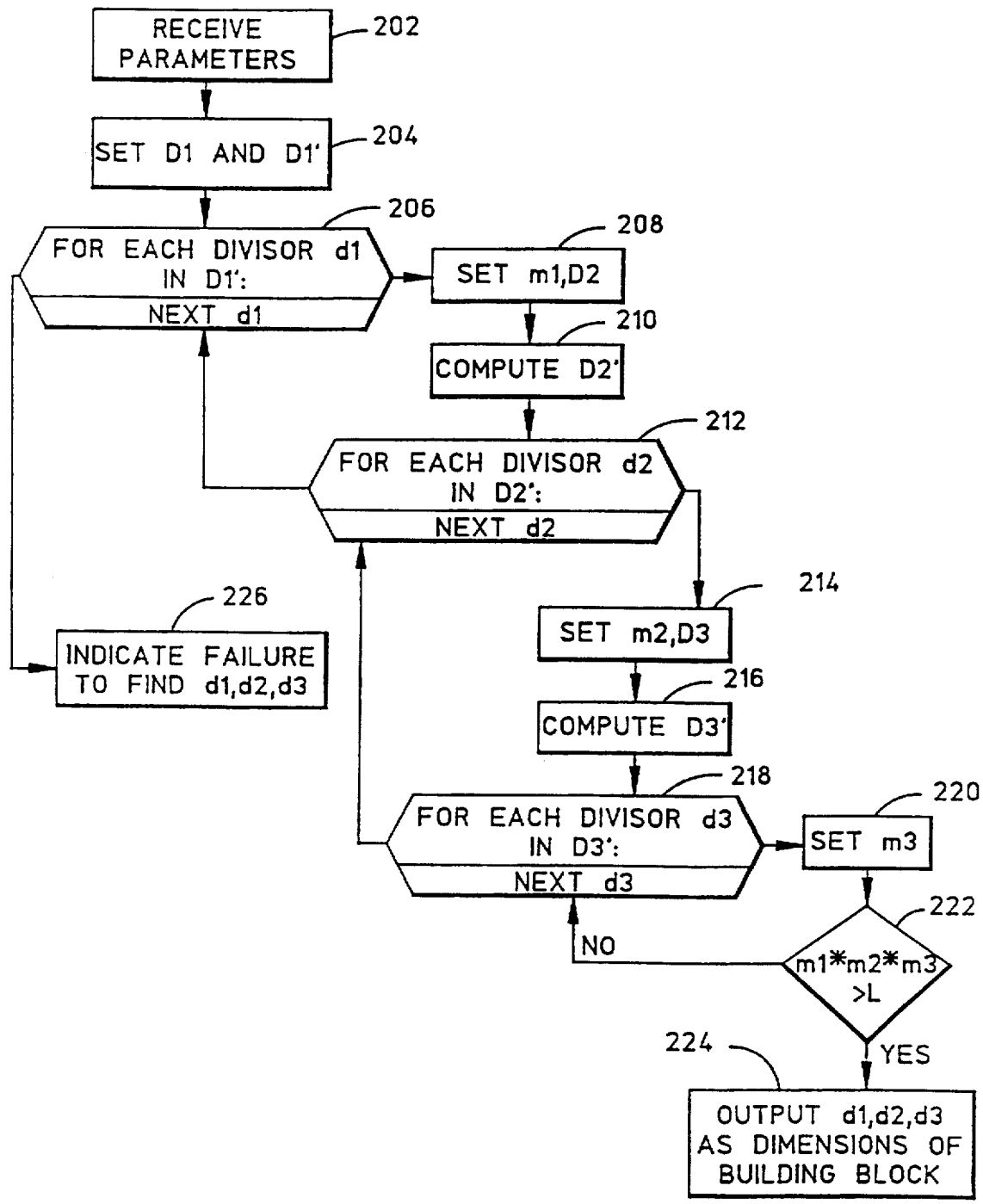
FIG. 3 is a flow diagram of the operational steps of the building block construction subsystem of the configuration manager illustrated in FIG. 1.

As noted, the building block constructed in the cluster assignment task can be larger or smaller than the system critical box along any dimension. It is essential that the building block dimensions have a special relationship with the dimensions of the critical box, namely, that the number which is the product of the minimums of the building block and critical box dimensions exceed the maximum number of clusters that can be operated simultaneously in the system. The flow diagram represented by FIG. 3 gives one method for determining if a building block exists that satifies the special relationship. FIG. 3 comprises the preferred embodiment of the building block construction subsystem represented by the flow diagram box numbered 106 in FIG. 2.

The processing in the building block construction subsystem can be modified to output all possible building blocks, so that the configuration manager can select among the choices an optimal one with regard to other considerations of the overall design, if necessary. It could easily be modified to satisfy additional criteria or include other specific restrictions on the dimensions of the building block that may be desired by the system. For example, it might be desirable to select the most nearly cube-shaped building block or a block of predetermined size. The modifications to operate in either manner should be apparent to those skilled in the art in view of this description. Furthermore, other schemes for determining building block dimensions that satisfy the necessary requirements may occur to those skilled in the art.

The first step in the operation of the building block construction subsystem, as represented by the flow diagram box numbered 202 in FIG. 3, is to receive the parameters comprising the device array dimensions $n1$, $n2$, $n3$, the critical box dimensions $k1$, $k2$, $k3$, the number of clusters C, and the maximum number L of clusters operated simultaneously. As noted above, the parameters can be obtained at system start-up or initialization, or can be obtained interactively in real time. It should be understood that the computations described below relate to integer arithmetic operations.

Next, at the box numbered 204, a parameter D1 is set equal to the greatest common divisor of C and the first dimension n1 of the device array and a set D1' is computed that consists of all divisors d1 of D1. The next step at box 206 is to carry out the following processing for each of the divisors d1 in the divisor set D1': at box 208, set a parameter m1 equal to the minimum of the present d1 and k1 and set a parameter D2 equal to the greatest common divisor of C and the product n1*n2, divided by the present d1; and at box 210 compute a set D2' consisting of all divisors d2 of the number D2. Then at box 212, for each d2 in the divisor set D2', carry out the following processing: at box 214, set a parameter m2 equal to the minimum of the present d2 and k2; and set a parameter D3 equal to C divided by the product of the present d1 and the present d2; and at box 216 compute a set D3' consisting of all divisors d3 of the number D3. Then at box 218, for each d3 in the divisor set D3', carry out the following processing: at box 220 set a parameter m3 equal to the minimum of the present d3 and k3.

At the decision box numbered 222, the building block construction subsystem checks to determine if the product m1*m2*m3 is greater than the number L received as input. If it is, then at box 224 the subsystem adopts the values of the present d1, d2, and d3 as the dimensions of the building block. Processing then returns to the configuration manager system. If the inequality is not satisfied at box 222, then the next value of d3 is obtained at box 218 and the next m3 is set back at the box numbered 220 for checking the inequality with the next m3. If all the d3 values are exhausted without finding the building block dimensions, then the next step is to get the next value of d2 at box 212 and repeat the m2 and D3 setting steps at box 214. Similarly, if all the d2 values are exhausted without finding the building block dimensions, then the next step is to get the next value of d1 at box 206 and repeat the m1 and D2 setting steps at box 208. Finally, if all of the d1 values are exhausted without a solution, then at box 226 the building block construction subsystem indicates to the configuration manager that a building block satisfying the problem-solving assumptions cannot be found.

If a suitable building block volume having dimensions d1, d2, d3 is determined by the process illustrated in FIG. 3, then it will satisfy the conditions that d1*d2*d3 divides C evenly, d1 is a divisor of n1, the product d1*d2 is a divisor of n1*n2 and the number M=m1*m2*m3 is greater than L, where m1 (or m2 or m3) is equal to the minimum of d1 (or d2 or d3, respectively) and k1 (or k2 or k3, respectively). Such conditions ensure that the devices in the device array can be assigned to clusters such that, in every critical box of dimensions (k1, k2, k3), at least (k1/m1)*(k2/m2)*(k3/m3) *(M-L) devices will be idle at all times, where each division is the minimum integer result.

Thus, FIG. 3 shows that the assignment task can be carried out by relatively simple integer numbering loop operations that do not require sophisticated computational power. Rather, such operations can be carried out in real time by, for example, an IBM Corporation "Personal Computer" or device of similar capability.

The processing steps performed by the building block construction subsystem in accordance with the steps illustrated in FIG. 3 also can be represented by the following pseudo-code:

```
Set D1:= gcd( C, n1 ) and compute
    a set D1' of all divisors of D1.
For each d1 of D1':
    Set m1:= min( d1, k1 ) and
    D2:= gcd( C, n1*n2 )/d1.
    Compute a set D2' of all divisors of D2.
    For each d2 of D2':
        Set m2:= min( d2, k2 ) and
        D3:=C/(d1*d2).
        Compute a set D3' of all divisors
            of D3.
        For each d3 of D3':
            Set m3:= min( d3, k3 ).
            If m1*m2*m3 > L then
                output the values d1, d2,
                d3 as the building block
                dimensions and exit, else
                get the next d3 and return
                to the step of setting m3.
        Get next d2 and return to the step
            of setting m2 and D3.
    Get next d1 and return to the step of setting
        m1 and D2.
Indicate failure to determine a suitable building block.
```

The operation "gcd" indicates a greatest common divisor function. The operation "min" indicates determining the minimum from among the operator arguments. It should be evident that the pseudo-code generally follows the processing illustrated in the flow diagram of FIG. 3 and described above, and therefore the pseudo-code requires no further explanation.

Figure 4:
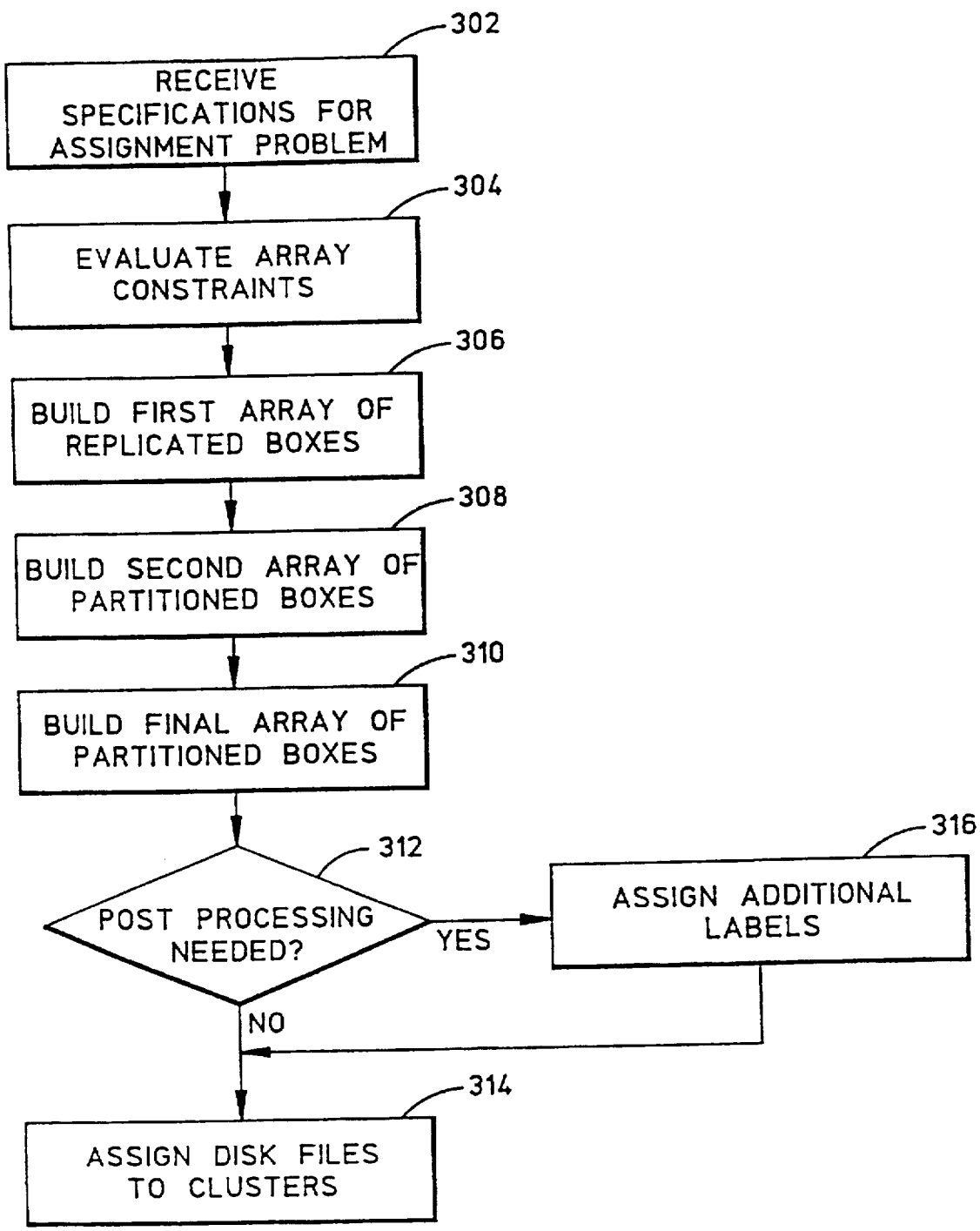
FIG. 4 is a flow diagram of the operational steps of the cluster assignment subsystem of the configuration manager illustrated in FIG. 1.

FIG. 4 illustrates the preferred implementation, in accordance with the present invention, of the configuration task illustrated in box 110 of FIG. 2 as performed by the system illustrated in FIG. 1. In the first step of processing, indicated by the FIG. 4 flow diagram box numbered 302, the configuration manager receives the specifications for the assignment task. The specifications include the dimensions of the device array (n1, n2, n3), the number of clusters (C), and the dimensions of the building block as determined and output by the building block construction subsystem, described above in connection with the flow diagram box 106 of FIG. 1. In a RAID disk system, for example, one cluster (L=1) is operated with each read and write operation.

At the flow diagram box numbered 304 in FIG. 4, the device array constraints are evaluated or calculated. This step comprises calculating a first partitioning limit number X=(n1*n2)/d1 and a second partitioning limit number Y=N/(d1*d2). Also evaluated are the device array volume N=n1*n2*n3 and the building block volume D=d1*d2*d3. At the next step indicated at the flow diagram box numbered 306, the configuration manager builds the first array of replicated boxes. This step comprises constructing a building block sub-volume of the device array. The processing step further includes constructing replications of the building block volume sufficient to encompass the device array volume and providing number labels for each cell of the replicated array. The replication is preferably carried out along the third critical box dimension d3 such that the resulting volume has dimensions of d1-by-d2-by-Y. The number labels in the replicated array will begin with numeral "1" and will proceed in numerical order until the value D=d1*d2*d3 is reached, so that each cell of the building block sub-volume has a different number label.

At the next step, indicated by box 308, a second array is built comprising a partitioning of the volume constructed in the previous step. In particular, the replicated array is partitioned along the d2 dimension such that the resulting volume has dimensions of d1-by-X-by-n3. The number labelling is maintained from the replicated array, so that the step 308 comprises merely a partitioning of the existing replicated array, not a construction of a different-value array. Next, at the flow diagram box numbered 310, a third and final array is constructed by partitioning the replicated array along the remaining d1 dimension to produce an array having dimensions n1-by-n2-by-n3. The resulting array comprises a device array-sized volume having cells that are labelled in multiples of the building block volume D.

At the next step, represented in FIG. 4 by the decision box numbered 312, the configuration manager checks for post-processing in the form of final number labelling. Post-processing is needed if the building block volume D is not equal to (and, necessarily, less than) the number of clusters C. The post-processing ensures that each cluster group contains the correct number of labels. If the post-processing is not needed, then processing proceeds to the step of assigning the disk devices in accordance with the number labelling, wherein each number label represents the assignment of the corresponding device to the numbered cluster, as represented by the flow diagram box numbered 314.

If post-processing is needed, then at the box numbered 316 the label assignment is carried out such that each repeated label within the building block volume is changed to a new label until the number labels equal the number of clusters. For example, if the building block volume contains sixty cells, or elements, and the number of clusters is one hundred-twenty, then without the post-processing each cluster from cluster number "1" to cluster number "60" will have two times as many devices as required and there will be no devices in each cluster from number "61" to number "120". If the building block cells are labelled sequentially, then the sixty-first device of the device array will be assigned cluster "1", the sixty-second device will be assigned cluster "2", and so forth. The post-processing represented by the flow diagram box numbered 316 comprises changing the sixty-first device assignment to a new cluster number, "61", changing the sixty-second device assignment to a new cluster number, "62", and so forth until the last device is reassigned from cluster "60" to cluster "120". Similarly, if the number of clusters was three hundred and the critical box volume was sixty, then the post-processing would reassign the sixty-first device to cluster "61" and so forth so that the last device was reassigned from cluster "60" to cluster "300". After the cluster label post-processing, operation of the system proceeds with the assignment step at the flow diagram box numbered 314.

Before the post-processing, each subarray having dimensions d1-by-d2-by-d3 will have assigned to it exactly one of each of the number labels 1, 2, . . . , D. After any necessary label post-processing, some of the labels may change but the process will complete with it being the case that no label is repeated in any such subarray. In addition, because of the conditions on the building block imposed by its construction, any critical box will have a subarray of dimensions m1-by-m2-by-m3 with no repeated labels and sufficient distinct labels so that at least one cluster within that subarray will not be operational with each operation of the system.

Figure 5:
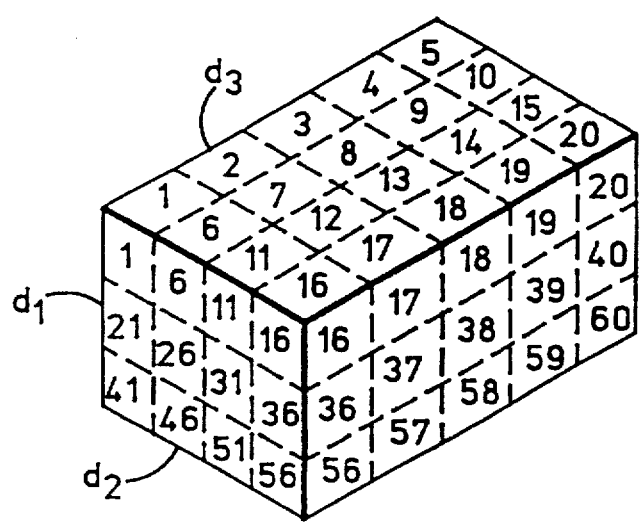
FIGS. 5, 6, 7, and 8 are graphical representations of the operational steps of the preliminary assignment process illustrated in FIG. 4.

FIGS. 5, 6, 7, and 8 graphically represent the processing followed by the configuration manager 16 in carrying out the cluster assignment task represented by the FIG. 2 flow diagram box numbered 110. A hypothetical system to be configured, for purposes of FIGS. 5-8, comprises storage devices arranged in an array of dimensions n1-by-n2-by-n3 devices. The number N of devices in the array therefore is N=n1*n2*n3. FIG. 5 represents a building block sub-volume having dimensions d1-by-d2-by-d3. The number D of devices in the building block is D=d1*d2*d3.

To perform the cluster assignment task in accordance with the invention, a number of assumptions are made. At minimum, the volume of the building block must be an integer divisor of the number of clusters, the first axis dimension of the building block must be an integer divisor of the first axis dimension of the device array, and the product of the first two axis dimensions of the building block must be an integer divisor of the product of the first two axis dimensions of the device array. Furthermore, it is necessary that the product of the numbers comprising the smaller of each axis dimension of the building block and the corresponding axis dimension of the critical box be strictly larger than the maximum number of clusters that can be operated substantially simultaneously. These conditions are guaranteed if the building block construction succeeds and control has passed to this stage of the system. This ensures that a cluster assignment can be produced so that every critical box contains at most one device from some cluster that is not operational at any time. The size of the building block volume used to make the label assignments can be varied with respect to the critical box. If the volume of the building block is less than the number of clusters, then the labels in the final partitioned array may be subdivided so as to exhaust the number of clusters and ensure no duplication of cluster assignments within a building block.

Figure 6:
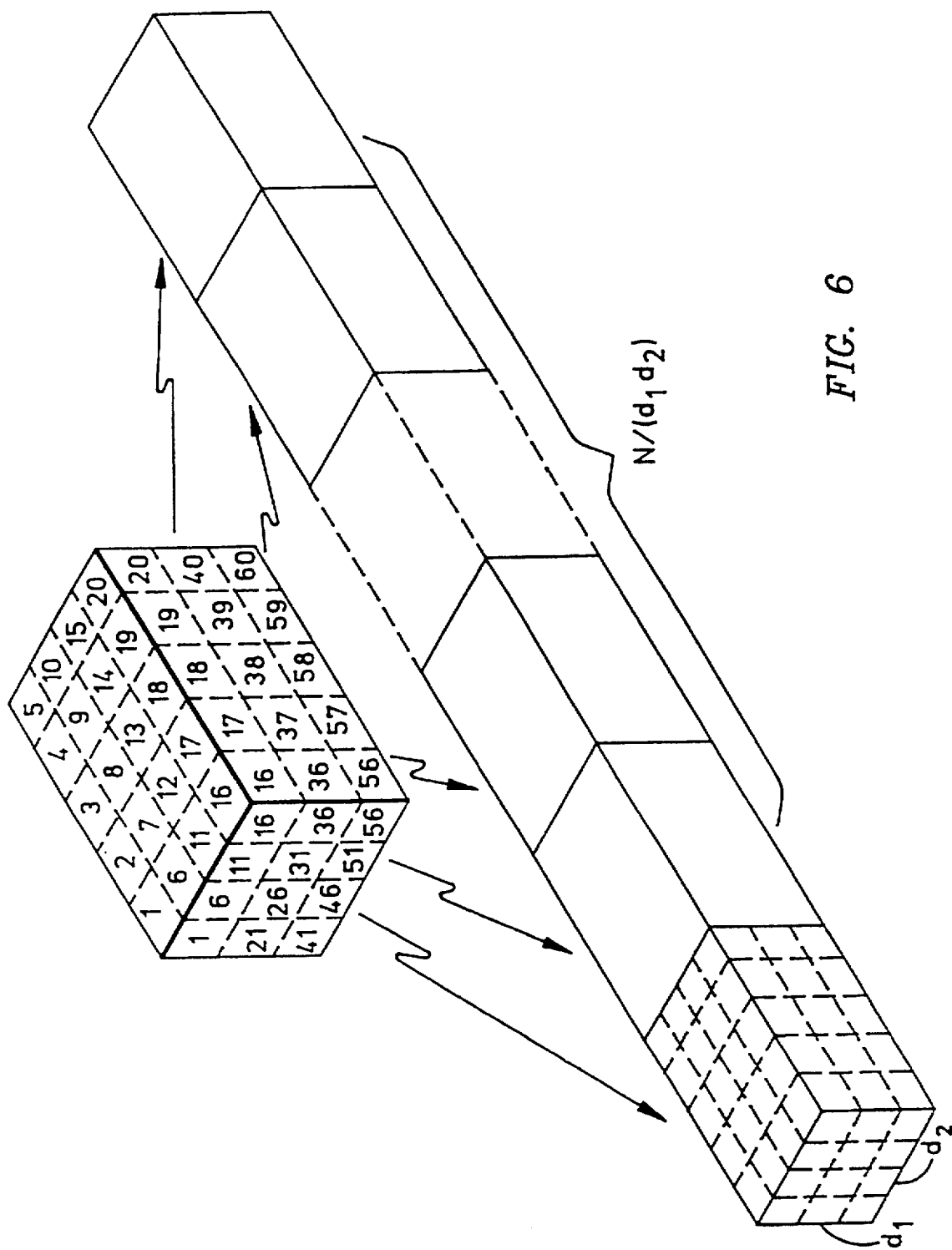

The first step in the cluster assignment, as illustrated in FIG. 5, is to assign a preliminary label to each cell in the building block. The building block is used to assign all of the storage devices in the array to a cluster group. FIG. 5 shows that the exemplary building block has dimensions of 3-by-4-by-5 and therefore contains sixty cells, or storage devices. The preliminary labels are arbitrarily assigned first along the d3 dimension, then along the d2 dimension, and lastly along the d1 dimension. Next, as illustrated in FIG. 6, the building block is replicated along the d3 dimension sufficiently to exhaust the N devices in the device array. That is, there will be N/D duplicate building blocks joined together side-by-side in a long chain. In particular, the dimensions of the long chain illustrated in FIG. 6 will be d1-by-d2-by-[N/(d1*d2)]. Thus, the volume of the replicated building blocks is equal to the N devices of the device array. The FIG. 6 processing corresponds to the operation illustrated and described in conjunction with box 306 of FIG. 4.

Figure 7:
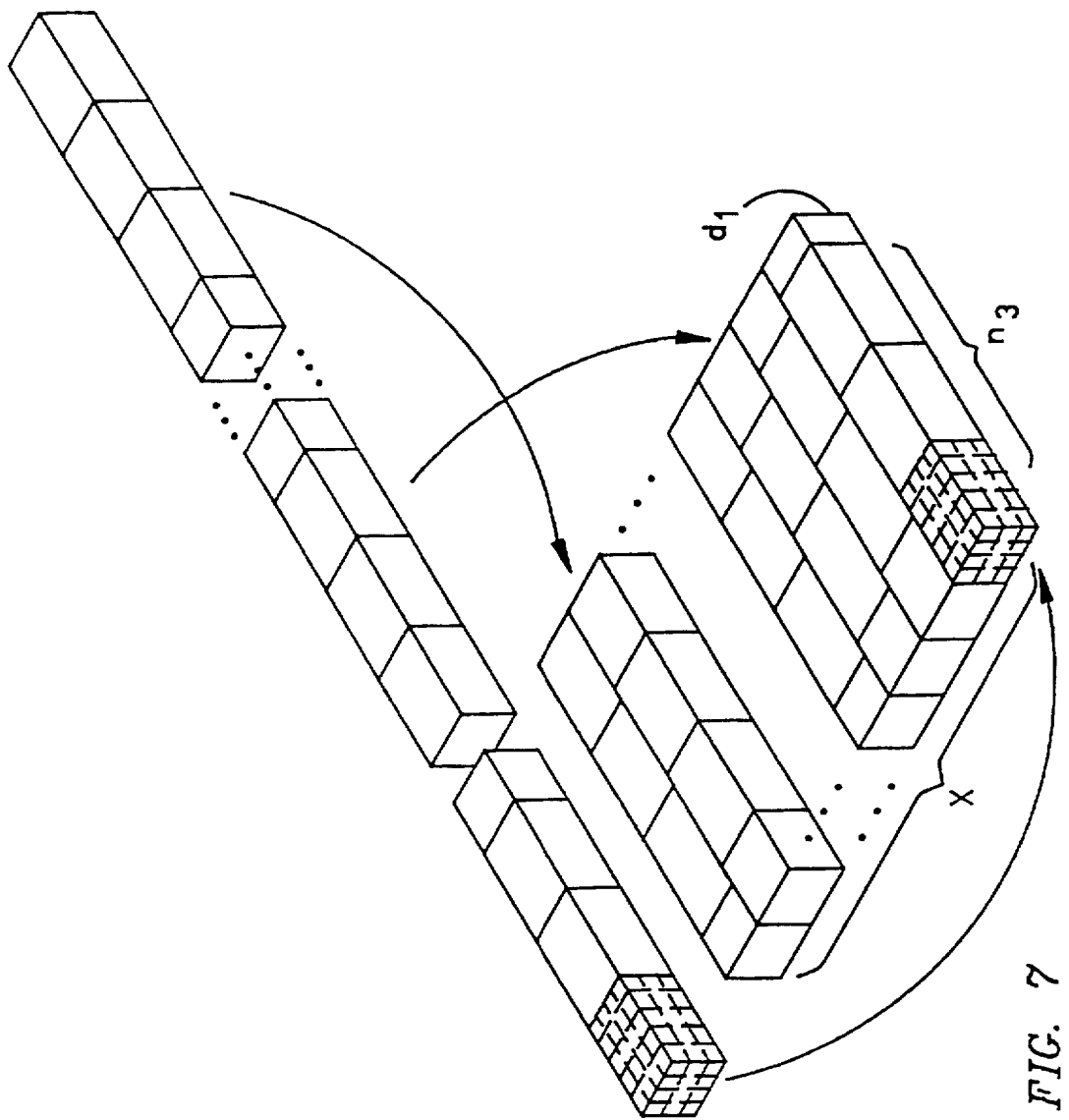

A condition of the cluster assignment is that the product d1*d2 evenly divides the product n1*n2. Therefore, the length-wise dimension of the volume illustrated in FIG. 6 is evenly divisible by n3. The next step in the configuration procedure is to partition the FIG. 6 volume into multiple segments, each of length n3. This is illustrated in FIG. 7. The number of segments produced by this partitioning is equal to (n1*n2)/(d1*d2). FIG. 7 shows that, with the partitioning, the multiple segments are joined (without changing relative orientation) in the d2 direction. The resulting volume has dimensions d1-by-X-by-n3, where X=n1*n2/d1. The FIG. 7 processing corresponds to the operation illustrated and described in conjunction with box 308 of FIG. 4.

Figure 8:
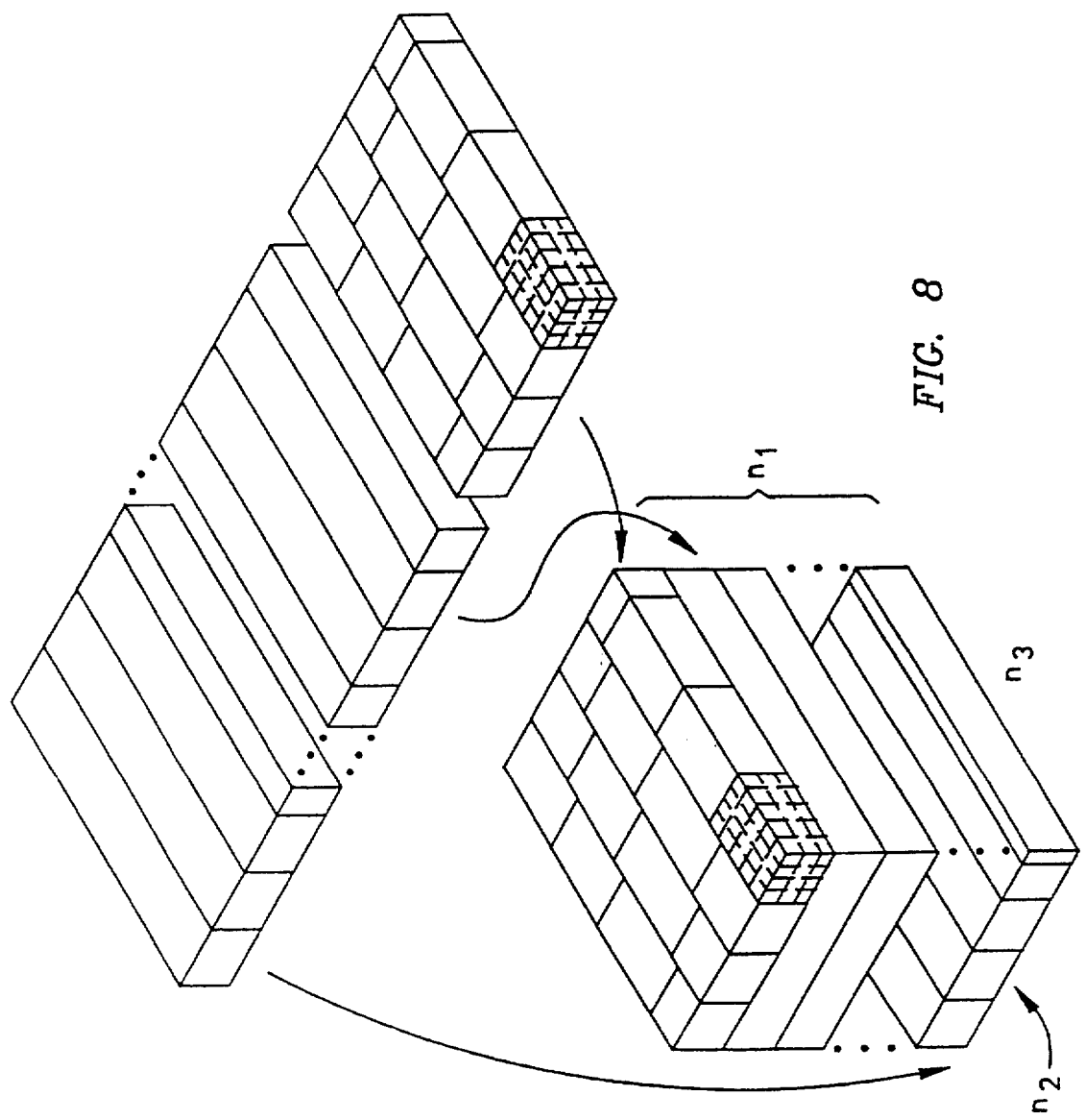

Another condition of the cluster assignment is that d1 evenly divides n1. Therefore, X is evenly divisible by n2 and the FIG. 7 volume can be partitioned into multiple segments, each of width n2. The segments are joined in the d1 direction, as illustrated in FIG. 8, thereby forming a stacked volume having dimensions n1-by-n2-by-n3. This completes the preliminary labelling and construction of the configuration process. It should be apparent that each building block illustrated in FIG. 8 is a permutation of the labels in the initial building block. It also should be apparent that the FIG. 8 processing corresponds to the operation illustrated and described in conjunction with box 310 of FIG. 4.

The last step of the cluster assignment is to assign devices having a given number label to cluster groups. This can be done in a variety of ways, so long as every building block in the device array contains at most one device from each cluster group. For example, one scheme for assigning devices to cluster groups is to systematically sweep through the array, sweeping from front to back, left to right, and top to bottom, assigning the device of the number label i to the cluster group $J=((i-1)*Z)+j$, where j is defined to be n mod Z, with $1<=j<=Z$ and $Z=C/D$. This is the scheme used in the preferred embodiment, and is described further below in conjunction with an exemplary FORTRAN computer code listing. Another cluster assignment scheme is to systematically scan the array as described, with random assignment of number labels to cluster groups subject to the condition that, once a cluster group has N/C devices in it, its number label is excluded from continued use. Other schemes for scanning and assigning cluster groups will occur to those skilled in the art.

Table 1 contains a listing of a FORTRAN-language computer code for a main program that implements the preferred embodiment of the cluster assignment task carried out by the configuration manager of the system described above by making appropriate subroutine calls. Table 2 is a listing of a FORTRAN-language subroutine called START which dimensions arrays for the given problem. Table 3 is a listing of a FORTRAN-language subroutine called ARRPACK that carries out the building block labelling, replication, and partitioning described above. Table 4 is a listing of a FORTRAN-language function subroutine called MYMOD that provides an integer remainder function used in the labelling procedure. The lines of the FORTRAN-language code are numbered at the right margin, except for the comment lines embedded in the code. Finally, Table 5 is a listing of the output produced by the FORTRAN-language code of Tables 1–4.

Table 1 is a listing of a sample main program which comprises assigning some storage (lines 1–3), reading in the problem parameters (lines 4–5), and calling the initializing subroutine START (line 6).

Table 2 is a listing of the subroutine START. This START routine properly dimensions the multi-dimensional arrays (lines 3–4), calls the computational routine ARRPACK (line 5) and prints the cluster assignments (lines 6–18).

Table 3 is a listing of the subroutine ARRPACK, which first defines various parameters and working constants (lines 3–9). The array comprises an n1-by-n2-by-n3 array that will be filled with the cluster number labels. The arrays "ABAR," "AHAT," and "COUNT" comprise working arrays. The parameters d1, d2, and d3 comprise the respective dimensions of the building block. In Table 3, the first array is constructed in lines 10–19 and has dimensions of d1-by-d2-by-Y. The second array, comprising a partitioning of the first array, is performed in lines 20–30. The second array has dimensions of d1-by-X-by-n3. Finally, the third array is constructed in lines 31–41 and has dimensions of n1-by-n2-by-n3.

The construction of the third array produces an array with the correct dimensions and correct preliminary labels. The next portion of the code assigns disk devices to clusters 1 through C using a count parameter to keep track of the number of times a particular label "j" has been encountered (lines 42–44). In line 45, if C is equal to D then no sub-partitioning, or post-processing, is needed and the routine ends. Next, a parameter "Z" is defined for any sub-partitioning of the labels, if necessary, at line 46. In lines 47–56, the relabeling is accomplished. The exemplary label post-processing implemented by lines 47–56 comprises sweeping serially through the device array along each dimension and assigning the nth occurrence of the ith label to a cluster number J where:

$$J=((i-1)*Z)+j, \text{ where } j=1, 2 \ldots, Z \text{ and } j=n \text{ mod } Z \text{ for } Z=C/D.$$

Table 4 is a listing of a modulo function well-known to those skilled in the art. The function is used by the ARRPACK subroutine. Finally, Table 5 is an output listing that illustrates exemplary cluster assignments for devices in the array specified by the listed parameters, as performed by the FORTRAN program listing of Tables 1–4. Such cluster assignments produced by the configuration manager will be used by the power manager in controlling the operation of the devices in the array.

Thus, a computer storage system in accordance with the present invention assigns disk storage devices of a device array to operating clusters by defining building blocks that can be smaller, larger, or equal in size to a critical box. The number labels that are assigned to the cells of the building blocks automatically provide device cluster assignments such that no more than one device from a cluster is present in any building block if each building block has a volume equal to the number of clusters. If the building block has a volume less than the number of clusters, then an additional processing step is used to add number labels to the cells of the various building blocks until the number of clusters is exhausted.

The present invention has been described above in terms of a presently preferred embodiment so that an understanding of the present invention can be conveyed. There are, however, many configurations for data storage systems not specifically described herein but with which the present invention is applicable. The present invention should therefore not be seen as limited to the particular embodiment described herein, but rather, it should be understood that the present invention has wide applicability with respect to data storage systems generally. All modifications, variations, or equivalent arrangements that are within the scope of the attached claims should therefore be considered to be within the scope of the invention.

TABLE 1

```
      program main
*
*           Initialize workspace and read parameter values
*
      implicit integer(a-z)                                     1
      integer aa(20000), ab(20000), ac(20000), work(5000)       2
      integer n1,n2,n3,d1,d2,d3,C                               3
*
*           Define the 7 parameters which are the input to the
*           assignment process.
*
*     n1      - 1st dimension of array
*     n2      - 2nd dimension of array
*     n3      - 3rd dimension of array
*     d1      - 1st dimension of building block
*     d2      - 2nd dimension of building block
*     d3      - 3rd dimension of building block
*     C       - number of clusters
      read (*,7000) n1,n2,n3,d1,d2,d3,C                         4
70000 format(7i4)                                               5
*
      call Start(aa,ab,ac,work,n1,n2,n3,d1,d2,d3,C)             6
*
      stop                                                      7
      end                                                       8
```

TABLE 2

```
             subroutine Start(aa,ab,ac,work,n1,n2,n3,d1,d2,d3,C)     1
*
*      This is a sample outer subroutine. It dimensions the
*      arrays, then call the primary subroutine, and handles
*      output.
*
       implicit integer(a-z)                                          2
       integer aa(n1,n2,n3)                                           3
       integer ab(*), ac(*), work(*)                                  4
*
*      Call the primary subroutine
*
       call Arrpack(aa,ab,ac,work,n1,n2,n3,d1,d2,d3,C)                5
*
*      Output the cluster assignments.
*      print 8000, n1,n2,n3,d1,d2,d3,C                                6
 8000  format (' Array dimensions n1,n2,n3 =',2(1x,i4,','),1x,i4,/,   7
      +        ' Building block size d1,d2,d3 =',2(1x,i4,','),1x,i4,/,8
      +        ' Number of clusters C =',i5,/)                         9
       print *,' Cluster assignments, by i3 the (i1,i2)'              10
       print *, ' '                                                   11
       do k = 1,n3                                                    12
         do i = 1,n1                                                  13
           print 8010, (aa(i,j,k), j=1,n2)                            14
 8010      format(1x, 30i4)                                           15
         enddo                                                        16
       print *, ' '                                                   17
       enddo                                                          18
       return                                                         19
       end                                                            20
```

TABLE 3

```
       Subroutine Arrpack(a,abar,ahat,count,n1,n2,n3,d1,d2,d3,C)      1
*
*      Parameter list
*
*      a        - The n1*n2*n3 array to be filled with cluster numbers
*      abar     - 1st work array ( at least as big as a)
*      ahat     - 2nd work array ( at least as big as a)
*      count    - work array (at least C/D in length)
*      n1       - 1st dimension of array a
*      n2       - 2nd dimension of array a
*      n3       - 3rd dimension of array a
*      d1       - 1st dimension of building block
*      d2       - 2nd dimension of building block
*      d3       - 3rd dimension of building block
*      C        - number of clusters
*
       implicit integer(a-z)                                          2
       integer abar(d1,d2,*), ahat(d1,n2*n1/d1,n3), a(n1,n2,n3)       3
       integer count (*)                                              4
*
*      Evaluate some constants for looping
*
       N = n1*n2*n3                                                   5
       D = d1*d2*d3                                                   6
       X = (n1*n2)/d1                                                 7
       Y = N/(d1*d2)                                                  8
       label = 0                                                      9
*
*      Build the first array of dimension d1 * d2 * Y
*
       do i1 = 1, d1                                                 10
         do i2 = 1, d2                                               11
           do i3 = 1,d3                                              12
             label = label + 1                                       13
             do j = i3, Y, d3                                        14
               abar(i1,i2,j) = label                                 15
             enddo                                                   16
           enddo                                                     17
         enddo                                                       18
       enddo                                                         19
*
*      Build the second array of dimension d1 * X * n3
```

TABLE 3-continued

```
       do i1 = 1, d1                                                 20
         do i2 = 1, d2                                               21
           do i3 = 1, n3                                             22
             ip = i2 - d2                                            23
             do j = i3, Y, n3                                        24
               ip = ip + d2                                          25
               ahat(i1, ip, i3) = abar(i1, i2, j)                    26
             enddo                                                   27
           enddo                                                     28
         enddo                                                       29
       enddo                                                         30
*
*      Build the the third (final) array of dimension n1 * n2 * n3
*
       do i1 = 1, d1                                                 31
         do i3 = 1, n3                                               32
           do i2 = 1, n2                                             33
             ip = i1 - d1                                            34
             do j = i2, X, n2                                        35
               ip = ip + d1                                          36
               a(ip, i2, i3) = ahat(i1, j, i3)                       37
             enddo                                                   38
           enddo                                                     39
         enddo                                                       40
       enddo                                                         41
*
*      We now have an array a of the correct dimensions
*      with correct preliminary labels.
*      The next step uses them to assign files to clusters
*      1,..., C. Use count(j) to keep account of the number
*      of times label j has been encountered
*
       do j = 1, D                                                   42
         count(j) = 0                                                43
       enddo                                                         44
*      Return if no labeling needed
       if (C .eq. D) return                                          45
*      For convenience, define Z:
       Z = C/D                                                       46
       do i1 = 1, n1                                                 47
         do i2 = 1, n2                                               48
           do i3 = 1, n3                                             49
             label = a(i1,i2,i3)                                     50
             nth = count(label) + 1                                  51
             a(i1, i2, i3) = (label - 1)*Z + mymod(nth,Z)            52
             count(label) = nth                                      53
           enddo                                                     54
         enddo                                                       55
       enddo                                                         56
*
       return                                                        57
       end                                                           58
```

TABLE 4

```
       integer function mymod(n,m)
       implicit integer(a-z)                                          1
       k=mod(n,m)                                                     2
       if (k .eq. 0) k=m                                              3
       mymod=k                                                        4
       return                                                         5
       end                                                            6
```

TABLE 5

Array dimensions n1,n2,n3 = 15, 7, 10
Building block size d1,d2,d3 = 5, 3, 7
Number of clusters C = 210

Cluster assignments, by i3 then (i1,i2)

| 1  | 15 | 29  | 8  | 22  | 36  | 13 |
|----|----|-----|----|-----|-----|----|
| 43 | 57 | 71  | 50 | 64  | 78  | 55 |
| 85 | 99 | 113 | 92 | 106 | 120 | 97 |

TABLE 5-continued

Array dimensions n1,n2,n3 = 15, 7, 10
Building block size d1,d2,d3 = 5, 3, 7
Number of clusters C = 210

Cluster assignments, by i3 then (i1,i2)

| | | | | | | |
|---|---|---|---|---|---|---|
| 127 | 141 | 155 | 134 | 148 | 162 | 139 |
| 169 | 183 | 197 | 176 | 190 | 204 | 181 |
| 27 | 41 | 5 | 19 | 33 | 12 | 26 |
| 69 | 83 | 47 | 61 | 75 | 54 | 68 |
| 111 | 125 | 89 | 103 | 117 | 96 | 110 |
| 153 | 167 | 131 | 145 | 159 | 138 | 152 |
| 195 | 209 | 173 | 187 | 201 | 180 | 194 |
| 40 | 4 | 18 | 32 | 9 | 23 | 37 |
| 82 | 46 | 60 | 74 | 51 | 65 | 79 |
| 124 | 88 | 102 | 116 | 93 | 107 | 121 |
| 166 | 130 | 144 | 158 | 135 | 149 | 163 |
| 208 | 172 | 186 | 200 | 177 | 191 | 205 |
| 3 | 17 | 31 | 10 | 24 | 38 | 2 |
| 45 | 59 | 73 | 52 | 66 | 80 | 44 |
| 87 | 101 | 115 | 94 | 108 | 122 | 86 |
| 129 | 143 | 157 | 136 | 150 | 164 | 128 |
| 171 | 185 | 199 | 178 | 192 | 206 | 170 |
| 16 | 30 | 7 | 21 | 35 | 14 | 28 |
| 58 | 72 | 49 | 63 | 77 | 56 | 70 |
| 100 | 114 | 91 | 105 | 119 | 98 | 112 |
| 142 | 156 | 133 | 147 | 161 | 140 | 154 |
| 184 | 198 | 175 | 189 | 203 | 182 | 196 |
| 42 | 6 | 20 | 34 | 11 | 25 | 39 |
| 84 | 48 | 62 | 76 | 53 | 67 | 81 |
| 126 | 90 | 104 | 118 | 95 | 109 | 123 |
| 168 | 132 | 146 | 160 | 137 | 151 | 165 |
| 210 | 174 | 188 | 202 | 179 | 193 | 207 |
| 5 | 19 | 33 | 12 | 26 | 40 | 4 |
| 47 | 61 | 75 | 54 | 68 | 82 | 46 |
| 89 | 103 | 117 | 96 | 110 | 124 | 88 |
| 131 | 145 | 159 | 138 | 152 | 166 | 130 |
| 173 | 187 | 201 | 180 | 194 | 208 | 172 |
| 18 | 32 | 9 | 23 | 37 | 1 | 15 |
| 60 | 74 | 51 | 65 | 79 | 43 | 57 |
| 102 | 116 | 93 | 107 | 121 | 85 | 99 |
| 144 | 158 | 135 | 149 | 163 | 127 | 141 |
| 186 | 200 | 177 | 191 | 205 | 169 | 183 |
| 29 | 8 | 22 | 36 | 13 | 27 | 41 |
| 71 | 50 | 64 | 78 | 55 | 69 | 83 |
| 113 | 92 | 106 | 120 | 97 | 111 | 125 |
| 155 | 134 | 148 | 162 | 139 | 153 | 167 |
| 197 | 176 | 190 | 204 | 181 | 195 | 209 |
| 7 | 21 | 35 | 14 | 28 | 42 | 6 |
| 49 | 63 | 77 | 56 | 70 | 84 | 48 |
| 91 | 105 | 119 | 98 | 112 | 126 | 90 |
| 133 | 147 | 161 | 140 | 154 | 168 | 132 |
| 175 | 189 | 203 | 182 | 196 | 210 | 174 |
| 20 | 34 | 11 | 25 | 39 | 3 | 17 |
| 62 | 76 | 53 | 67 | 81 | 45 | 59 |
| 104 | 118 | 95 | 109 | 123 | 87 | 101 |
| 146 | 160 | 137 | 151 | 165 | 129 | 143 |
| 188 | 202 | 179 | 193 | 207 | 171 | 185 |
| 31 | 10 | 24 | 38 | 2 | 16 | 30 |
| 73 | 52 | 66 | 80 | 44 | 58 | 72 |
| 115 | 94 | 108 | 122 | 86 | 100 | 114 |
| 157 | 136 | 150 | 164 | 128 | 142 | 156 |
| 199 | 178 | 192 | 206 | 170 | 184 | 198 |
| 9 | 23 | 37 | 1 | 15 | 29 | 8 |
| 51 | 65 | 79 | 43 | 57 | 71 | 50 |
| 93 | 107 | 121 | 85 | 99 | 113 | 92 |
| 135 | 149 | 163 | 127 | 141 | 155 | 134 |
| 177 | 191 | 205 | 169 | 183 | 197 | 176 |
| 22 | 36 | 13 | 27 | 41 | 5 | 19 |
| 64 | 78 | 55 | 69 | 83 | 47 | 61 |
| 106 | 120 | 97 | 111 | 125 | 89 | 103 |
| 148 | 162 | 139 | 153 | 167 | 131 | 145 |
| 190 | 204 | 181 | 195 | 209 | 173 | 187 |
| 33 | 12 | 26 | 40 | 4 | 18 | 32 |
| 75 | 54 | 68 | 82 | 46 | 60 | 74 |
| 117 | 96 | 110 | 124 | 88 | 102 | 116 |
| 159 | 138 | 152 | 166 | 130 | 144 | 158 |
| 201 | 180 | 194 | 208 | 172 | 186 | 200 |
| 11 | 25 | 39 | 3 | 17 | 31 | 10 |
| 53 | 67 | 81 | 45 | 59 | 73 | 52 |
| 95 | 109 | 123 | 87 | 101 | 115 | 94 |
| 137 | 151 | 165 | 129 | 143 | 157 | 136 |
| 179 | 193 | 207 | 171 | 185 | 199 | 178 |
| 24 | 38 | 2 | 16 | 30 | 7 | 21 |
| 66 | 80 | 44 | 58 | 72 | 49 | 63 |
| 108 | 122 | 86 | 100 | 114 | 91 | 105 |
| 150 | 164 | 128 | 142 | 156 | 133 | 147 |
| 192 | 206 | 170 | 184 | 198 | 175 | 189 |
| 35 | 14 | 28 | 42 | 6 | 20 | 34 |
| 77 | 56 | 70 | 84 | 48 | 62 | 76 |
| 119 | 98 | 112 | 126 | 90 | 104 | 118 |
| 161 | 140 | 154 | 168 | 132 | 146 | 160 |
| 203 | 182 | 196 | 210 | 174 | 188 | 202 |
| 13 | 27 | 41 | 5 | 19 | 33 | 12 |
| 55 | 69 | 83 | 47 | 61 | 75 | 54 |
| 97 | 111 | 125 | 89 | 103 | 117 | 96 |
| 139 | 153 | 167 | 131 | 145 | 159 | 138 |
| 181 | 195 | 209 | 173 | 187 | 201 | 180 |
| 26 | 40 | 4 | 18 | 32 | 9 | 23 |
| 68 | 82 | 46 | 60 | 74 | 51 | 65 |
| 110 | 124 | 88 | 102 | 116 | 93 | 107 |
| 152 | 166 | 130 | 144 | 158 | 135 | 149 |
| 194 | 208 | 172 | 186 | 200 | 177 | 191 |
| 37 | 1 | 15 | 29 | 8 | 22 | 36 |
| 79 | 43 | 57 | 71 | 50 | 64 | 78 |
| 121 | 85 | 99 | 113 | 92 | 106 | 120 |
| 163 | 127 | 141 | 155 | 134 | 148 | 162 |
| 205 | 169 | 183 | 197 | 176 | 190 | 204 |
| 2 | 16 | 30 | 7 | 21 | 35 | 14 |
| 44 | 58 | 72 | 49 | 63 | 77 | 56 |
| 86 | 100 | 114 | 91 | 105 | 119 | 98 |
| 128 | 142 | 156 | 133 | 147 | 161 | 140 |
| 170 | 184 | 198 | 175 | 189 | 203 | 182 |
| 28 | 42 | 6 | 20 | 34 | 11 | 25 |
| 70 | 84 | 48 | 62 | 76 | 53 | 67 |
| 112 | 126 | 90 | 104 | 118 | 95 | 109 |
| 154 | 168 | 132 | 146 | 160 | 137 | 151 |
| 196 | 210 | 174 | 188 | 202 | 179 | 193 |
| 39 | 3 | 17 | 31 | 10 | 24 | 38 |
| 81 | 45 | 59 | 73 | 52 | 66 | 80 |
| 123 | 87 | 101 | 115 | 94 | 108 | 122 |
| 165 | 129 | 143 | 157 | 136 | 150 | 164 |
| 207 | 171 | 185 | 199 | 178 | 192 | 206 |
| 4 | 18 | 32 | 9 | 23 | 37 | 1 |
| 46 | 60 | 74 | 51 | 65 | 79 | 43 |
| 88 | 102 | 116 | 93 | 107 | 121 | 85 |
| 130 | 144 | 158 | 135 | 149 | 163 | 127 |
| 172 | 186 | 200 | 177 | 191 | 205 | 169 |
| 15 | 29 | 8 | 22 | 36 | 13 | 27 |
| 57 | 71 | 50 | 64 | 78 | 55 | 69 |
| 99 | 113 | 92 | 106 | 120 | 97 | 111 |
| 141 | 155 | 134 | 148 | 162 | 139 | 153 |
| 183 | 197 | 176 | 190 | 204 | 181 | 195 |
| 41 | 5 | 19 | 33 | 12 | 26 | 40 |
| 83 | 47 | 61 | 75 | 54 | 68 | 82 |
| 125 | 89 | 103 | 117 | 96 | 110 | 124 |
| 167 | 131 | 145 | 159 | 138 | 152 | 166 |
| 209 | 173 | 187 | 201 | 180 | 194 | 208 |
| 6 | 20 | 34 | 11 | 25 | 39 | 3 |
| 48 | 62 | 76 | 53 | 67 | 81 | 45 |
| 90 | 104 | 118 | 95 | 109 | 123 | 87 |
| 132 | 146 | 160 | 137 | 151 | 165 | 129 |
| 174 | 188 | 202 | 179 | 193 | 207 | 171 |
| 17 | 31 | 10 | 24 | 38 | 2 | 16 |
| 59 | 73 | 52 | 66 | 80 | 44 | 58 |
| 101 | 115 | 94 | 108 | 122 | 86 | 100 |
| 143 | 157 | 136 | 150 | 164 | 128 | 142 |
| 185 | 199 | 178 | 192 | 206 | 170 | 184 |
| 30 | 7 | 21 | 35 | 14 | 28 | 42 |
| 72 | 49 | 63 | 77 | 56 | 70 | 84 |
| 114 | 91 | 105 | 119 | 98 | 112 | 126 |

TABLE 5-continued

Array dimensions n1,n2,n3 = 15, 7, 10
Building block size d1,d2,d3 = 5, 3, 7
Number of clusters C = 210

Cluster assignments, by i3 then (i1,i2)

| 156 | 133 | 147 | 161 | 140 | 154 | 168 |
| 198 | 175 | 189 | 203 | 182 | 196 | 210 |

We claim:

1. A configuration management system for determining the assignment of logical files in a disk device array for retrieving and storing data across the disks according to the logical files in respective access operations, the system comprising:
   a cluster map having entries that identify logical clusters of disk devices and the disk devices corresponding to the logical clusters;
   a configuration manager that receives configuration constraints that specifies the dimensions and the volume N of the disk array, a number $\underline{C}$ of operational cluster groups to which the devices will be assigned, a number L of disk clusters indicating the maximum number of disk clusters that will be operated substantially simultaneously during access operations in the system, and the dimensions of a critical box representing an arrangement of the disk devices such that, if a disk device is assigned to each cell of the critical box and all devices in the critical box are operated simultaneously during the same access operation, then thermal operating restrictions of the disk devices will be exceeded, wherein the configuration manager assigns disk devices to clusters by performing the steps of:
      determining if the number of clusters $\underline{C}$ is an integer divisor of the volume $\underline{N}$ of the device array and halting further assignment processing if not;
      determining a logical building block comprising a logical sub-volume of the device array;
      assigning a preliminary number label to each cell of the device array, the number labels running from 1 to the building block volume and repeating until all the devices are assigned a label;
      assigning a final number label to each cell of the device array, each label corresponding to an assignment of the devices to operating clusters such that each device array cluster includes the same number of devices and each logical building block sub-volume of the device array includes at most one device from each cluster; and
      providing an output listing comprising the cells of the disk array and the corresponding labels representing assignment of disk devices to clusters of the disk array, said output listing defining the cluster map of the system; and
   an access manager that selects logical clusters in which data is to be retrieved or stored, receives access commands identifying data to be retrieved or stored in the disk array, and retrieves at most L cluster numbers from the cluster map that identifies the clusters on which the data is to be retrieved or stored.

2. A configuration management system as defined in claim 1, wherein the configuration manager determines the dimensions of the building block by performing the steps of:
   determining a set of dimension tuples defining possible building block dimensions and for each dimension tuple in the set:
      determining if the product of the numbers which are the minimum of the possible building block dimensions and the corresponding critical box dimensions exceeds the number L;
      determining if the volume of the possible building block is an integer divisor of the number of clusters;
      determining if the first axis dimension of the possible building block is an integer divisor of the first axis dimension of the device array;
      determining if the product of the first two axis dimensions of the possible building block is an integer divisor of the product of the first two axis dimensions of the device array; and
   adopting as the selected building block dimensions any dimension tuple for which all the determinations are positive and indicating an error condition if no dimension tuple has all determinations positive.

3. A configuration management system as defined in claim 2, wherein the configuration manager performs the step of determining a set of dimension tuples by receiving an input set of dimension tuples from which the building block determination will be made.

4. A configuration management system as defined in claim 2, wherein the configuration manager performs the step of determining a set of dimension tuples by calculating a set of dimension tuples from which the building block determination will be made.

5. A configuration management system as defined in claim 2, wherein the configuration manager performs the step of adopting a dimension tuple as the selected building block dimensions by further performing the step of selecting, from among all the dimension tuples for which all the determinations are positive, one such tuple whose dimensions satisfy an additional criterion for selection.

6. A configuration management system as defined in claim 1, wherein the configuration manager performs the step of assigning preliminary labels by performing the steps of:
   assigning preliminary labels running from 1 to the building block volume to a logical building block of cells;
   logically replicating this building block with its preliminary labeled cells along the third axis dimension until a logical array of N cells are labeled;
   partitioning along the third axis dimension, in multiples of the third device array dimension, this logical array of cells into logical subarrays and attaching these logical subarrays with labeled cells along the second axis dimension; and
   partitioning along the second axis dimension, in multiples of the second device array dimension, this logical array of cells into logical subarrays and attaching these logical subarrays with labeled cells along the first axis dimension.

7. A configuration management system as defined in claim 1, wherein the configuration manager performs the step of assigning final number labels by performing the steps of:
   determining if the building block volume equals the number of clusters, and if so assigning disk devices to clusters according to their preliminary labels and if not, continuing;
   partitioning the preliminary labels according to any rule such that each array cluster includes the same number of disk devices and each building block sub-volume of the disk device array includes at most one disk device from each cluster.

8. A configuration management system as defined in claim 7, wherein the configuration manager performs the step of partitioning by performing the steps of:

scanning the device array along a first dimension of the array and assigning the nth occurrence of the ith label to a cluster number $J=((i-1)*Z)+j$, where, $j=1, 2, \ldots, Z$ and $j=n \mod Z$, the number Z indicating the ratio of the number of clusters to the building block volume; and repeating the scanning for the remaining dimensions of the array.

9. A configuration management system as defined in claim 7, wherein the configuration manager performs the step of partitioning by performing the steps of:

scanning the device array along a first dimension of the array and assigning the nth occurrence of the ith label to a randomly selected cluster;

maintaining a count of the number of devices assigned to each cluster; and excluding a cluster from selection in the step of scanning once N/C devices have been assigned to it.

10. A data storage and retrieval system comprising:

a plurality of disk devices in which data can be retrieved and recorded the disk devices being arranged in a disk array;

a configuration manager that defines logical clusters of disk devices in accordance with received configuration commands and assigns disk devices to the logical clusters, the disk devices being spatially dispersed from one another;

a configuration map that identifies the configuration commands and the logical clusters corresponding to the configuration commands; and a cluster map having entries that identify logical clusters of disk devices and the disk devices corresponding to the logical clusters;

wherein the configuration manager receives configuration constraints that specifies the dimensions and the volume N of the disk array, a number $\underline{C}$ of operational clusters to which the disk devices will be assigned, a number L of disk clusters indicating the maximum number of clusters that will be operated simultaneously during the access operations in the system, and the dimensions of a critical box representing an arrangement of the disk devices such that, if a disk device is assigned to each cell of the critical box and all devices in the critical box are operated simultaneously during the same access operation, then thermal operating restrictions of the disk devices will be exceeded and the configuration manager assigns the disk devices to the clusters by carrying out the steps of:

determining if the number of clusters $\underline{C}$ is an integer divisor of the volume $\underline{N}$ of the device array and halting further assignment processing if not;

determining a logical building block comprising a logical sub-volume of the device array;

assigning a preliminary number label to each cell of the device array, the number labels running from 1 to the building block volume and repeating until all the devices are assigned a label;

assigning a final number label to each cell of the device array, each label corresponding to an assignment of the devices to operating clusters such that each device array cluster includes the same number of devices and each logical building block sub-volume of the device array includes at most one device from each cluster; and providing an output listing comprising the cells of the disk array and the corresponding labels representing assignment of disk devices to cluster of the disk array, said output listing defining the cluster map of the system.

11. A data storage and retrieval system as defined in claim 10, wherein the configuration manager determines the dimensions of the building block by performing the steps of:

determining a set of dimension tuples defining possible building block dimensions and for each dimension tuple in the set:

determining if the product of the numbers which are the minimum of the possible building block dimensions and the corresponding critical box dimensions exceeds the number L;

determining if the volume of the possible building block is an integer divisor of the number of clusters;

determining if the first axis dimension of the possible building block is an integer divisor of the first axis dimension of the device array;

determining if the product of the first two axis dimensions of the possible building block is an integer divisor of the product of the first two axis dimensions of the device array; and adopting as the selected building block dimensions any dimension tuple for which all the determinations are positive and indicating an error condition if no dimension tuple has all determinations positive.

12. A data storage and retrieval system as defined in claim 11, wherein the configuration manager performs the step of determining a set of dimension tuples by receiving an input set of dimension tuples from which the building block determination will be made.

13. A data storage and retrieval system as defined in claim 11, wherein the configuration manager performs the step of determining a set of dimension tuples by calculating a set of dimension tuples from which the building block determination will be made.

14. A data storage and retrieval system as defined in claim 11, wherein the configuration manager performs the step of adopting a dimension tuple as the selected building block dimensions by further performing the step of selecting, from among all the dimension tuples for which all the determinations are positive, one such tuple whose dimensions satisfy an additional criterion for selection.

15. A data storage and retrieval system as defined in claim 10, wherein the configuration manager performs the step of assigning preliminary labels by performing the steps of:

assigning preliminary labels running from 1 to the building block volume to a logical building block of cells;

logically replicating this building block with its preliminary labeled cells along the third axis dimension until a logical array of N cells are labeled;

partitioning along the third axis dimension, in multiples of the third device array dimension, this logical array of cells into logical subarrays and attaching these logical subarrays with labeled cells along the second axis dimension; and partitioning along the second axis dimension, in multiples of the second device array dimension, this logical array of cells into logical subarrays and attaching these logical subarrays with labeled cells along the first axis dimension.

16. A data storage and retrieval system as defined in claim 10, wherein the configuration manager performs the step of assigning final number labels by performing the steps of:

determining if the building block volume equals the number of clusters, and if so assigning disk devices to clusters according to their preliminary labels and if not, continuing;

partitioning the preliminary labels according to any rule such that each array cluster includes the same number of disk devices and each building block sub-volume of the disk device array includes at most one disk device from each cluster.

17. A data storage and retrieval system as defined in claim 16, wherein the configuration manager performs the step of partitioning by performing the steps of:

scanning the device array along a first dimension of the array and assigning the nth occurrence of the ith label to a cluster number $J=((i-1)*Z)+j$, where, $j=1, 2, \ldots, Z$ and $j=n \bmod Z$, the number Z indicating the ratio of the number of clusters to the building block volume; and repeating the scanning for the remaining dimensions of the array.

18. A data storage and retrieval system as defined in claim 16, wherein the configuration manager performs the step of partitioning by performing the steps of:

scanning the device array along a first dimension of the array and assigning the nth occurrence of the ith label to a randomly selected cluster;

maintaining a count of the number of devices assigned to each cluster; and excluding a cluster from selection in the step of scanning once N/C devices have been assigned to it.

* * * * *